(12) United States Patent
Richmond et al.

(10) Patent No.: US 9,901,018 B1
(45) Date of Patent: Feb. 20, 2018

(54) ELECTRICALLY CONDUCTIVE HYBRID POLYMER MATERIAL

(71) Applicant: Delphi Technologies, Inc., Troy, MI (US)

(72) Inventors: Zachary J. Richmond, Warren, OH (US); Evangelia Rubino, Warren, OH (US); Anshuman Shrivastava, Twinsburg, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 15/490,249

(22) Filed: Apr. 18, 2017

(51) Int. Cl.
| | |
|---|---|
| *B60C 1/00* | (2006.01) |
| *H05K 9/00* | (2006.01) |
| *C08L 101/12* | (2006.01) |
| *H01B 1/12* | (2006.01) |
| *H01B 1/24* | (2006.01) |
| *H01B 7/17* | (2006.01) |
| *H01B 13/24* | (2006.01) |
| *H01B 3/00* | (2006.01) |
| *H01R 13/6599* | (2011.01) |

(52) U.S. Cl.
CPC .......... *H05K 9/0083* (2013.01); *C08L 101/12* (2013.01); *H01B 1/124* (2013.01); *H01B 1/24* (2013.01); *H01B 3/004* (2013.01); *H01B 7/17* (2013.01); *H01B 13/24* (2013.01); *H01R 13/6599* (2013.01); *C08L 2203/202* (2013.01)

(58) Field of Classification Search
CPC .......... H01B 1/124; H01B 1/24; H01B 13/24; H01B 7/17; H01B 3/004; H05K 9/0083; H01R 13/6599; C08L 101/12; C08L 2203/202

USPC ......................................................... 524/495
See application file for complete search history.

(56) References Cited

U.S. PATENT DOCUMENTS

| | | |
|---|---|---|
| 5,591,382 A | 1/1997 | Nahass et al. |
| 2003/0089892 A1 | 5/2003 | Fox et al. |
| 2004/0165369 A1 | 8/2004 | Lionetta et al. |

(Continued)

FOREIGN PATENT DOCUMENTS

GB    2462356 A    2/2010

*Primary Examiner* — Sherman Ng
(74) *Attorney, Agent, or Firm* — Robert J. Myers

(57) ABSTRACT

An electrically conductive hybrid polymer material is described herein. The hybrid polymer material includes 0.01% to 1% by weight of carbon nanoparticles, 1% to 10% by weight of a conductive polymeric material, 1% to 20% of electrically conductive fibers having a metallic surface and 69% or more by weight of a nonconductive polymeric base material. The carbon nanoparticles may be carbon nanotubes, graphite nanoparticles, graphene nanoparticles, and/or fullerene nanoparticles. The conductive polymeric material may be an inherently conductive polymer, a radical polymers, or an electroactive polymer. The electrically conductive fibers may be stainless steel fibers, metal plated carbon fibers, or metal nanowires. The nonconductive polymeric base material may be selected from materials that are pliable at temperatures between −40° C. and 125° C. or materials that are rigid in this temperature range. The hybrid polymer material may be used to provide EMI shielding for wire cables of housings of electrical assemblies.

20 Claims, 4 Drawing Sheets

(56) References Cited

U.S. PATENT DOCUMENTS

| | | | |
|---|---|---|---|
| 2005/0070657 A1* | 3/2005 | Elkovitch | B82Y 30/00 524/495 |
| 2006/0216517 A1* | 9/2006 | Handa | B29C 70/12 428/408 |
| 2006/0289189 A1 | 12/2006 | Aisenbrey | |
| 2007/0056769 A1* | 3/2007 | Severance | H05K 9/0015 174/356 |
| 2010/0069559 A1* | 3/2010 | Koning | B82Y 30/00 524/496 |
| 2011/0039064 A1 | 2/2011 | Wani et al. | |
| 2012/0177906 A1* | 7/2012 | Sousa | H05K 9/0083 428/297.4 |
| 2012/0228018 A1* | 9/2012 | McBain | H05K 9/0083 174/350 |
| 2013/0299732 A1* | 11/2013 | Kwak | B82Y 30/00 252/62.54 |
| 2014/0316073 A1 | 10/2014 | Locke et al. | |
| 2015/0083961 A1* | 3/2015 | Mrozek | C09K 5/14 252/74 |
| 2015/0353278 A9 | 12/2015 | Morris, III et al. | |

* cited by examiner ature may be polyethylene, polypropylene, and/or polyvinyl chloride. The hybrid polymer material made with these nonconductive polymeric materials is substantially pliable at temperatures between −40° C. and 125° C. This hybrid polymer material may be used to form a wire cable assembly that includes a wire cable surrounded by the hybrid polymer material.

ELECTRICALLY CONDUCTIVE HYBRID POLYMER MATERIAL

TECHNICAL FIELD OF THE INVENTION

The invention generally relates to an electrically conductive polymer material and more particularly to a hybrid polymer material that is electrically conductive.

BACKGROUND OF THE INVENTION

Conductive polymer materials are increasingly replacing metal materials for electromagnetic interference (EMI) shielding, radio frequency interference (RFI) shielding and electrostatic discharge ESD protection. Typically, metal shields increase part counts, require extra manufacturing steps to assembly, and add weight to the finished product. Using conductive polymers for EMI, RFI, and EDS shielding provides weight reduction, reduced manufacturing steps (and thus cost), and a greater freedom of design.

As shown in FIG. 1, the conductive polymers 1 have a conductive filler material 2, e.g. metal fibers, embedded in a nonconductive polymer matrix 3. These conductive polymers provide good through-plane electrical conductivity, but have a high surface resistance. For shielding applications, there needs to be transfer of charge from the inner conductive filler material to a ground connected to the surface of the conductive polymer material, which the high surface resistance prohibits. There are ways to create low resistance paths to the surface of conductive polymers but it adds complexity and therefore cost to the manufacturing process.

Additionally, the conducting efficiency of conductive polymers is low due to the low percentage of interconnections between the conductive filler particles. Given the amount of metal incorporated, the resistance value is many times higher than the amount of metal actually inside. Improving the interconnection of the metal fillers will decrease resistance and improve shielding properties of the composite. Improving this interconnection between filler will also reduce the percolation threshold, or how much filler is required to achieve adequate conductivity.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an electrically conductive hybrid polymer material is provided. The hybrid polymer material includes 0.01% to 1% by weight of carbon nanoparticles, 1% to 10% by weight of a conductive polymeric material, 1% to 20% of electrically conductive fibers having a metallic surface, 69% or more by weight of a nonconductive polymeric material.

The carbon nanoparticles may be carbon nanotubes, graphite nanoparticles, graphene nanoparticles, and/or fullerene nanoparticles. The conductive polymeric material may be an inherently conductive polymer, such as polyalanine, 3,4-ethylenedioxythiophene, 3,4-ethylenedioxythiophene polystyrene sulfonate, and 4,4-cyclopentadithiophene, a radical polymer, and/or an electroactive polymer.

The electrically conductive fibers having a metallic surface may be stainless steel fibers, metal plated carbon fibers, and metal nanowires.

The nonconductive polymeric material may be polyethylene, polypropylene, and/or polyvinyl chloride. The hybrid polymer material made with these nonconductive polymeric materials is substantially pliable at temperatures between −40° C. and 125° C. This hybrid polymer material may be used to form a wire cable assembly that includes a wire cable surrounded by the hybrid polymer material.

The nonconductive polymeric material may alternatively be acrylic, polyester, polybutylene terephthalate, acrylonitrile butadiene styrene, and/or polyamide. The hybrid polymer material made with these nonconductive polymeric materials is substantially rigid at temperatures between −40° C. and 125° C. This hybrid polymer material may be used to form an electrical assembly that includes a housing formed of the hybrid polymer material.

In accordance with another embodiment of the invention, an electrically conductive hybrid polymer material is provided. The hybrid polymer material essentially consists of 0.01% to 1% by weight of carbon nanoparticles, 1% to 10% by weight of a conductive polymeric material, 1% to 20% of electrically conductive fibers having a metallic surface, and the remaining percentage by weight is a nonconductive polymeric material.

The carbon nanoparticles may be carbon nanotubes, graphite nanoparticles, graphene nanoparticles, and/or fullerene nanoparticles. The conductive polymeric material may be an inherently conductive polymer, such as polyalanine, 3,4-ethylenedioxythiophene, 3,4-ethylenedioxythiophene polystyrene sulfonate, and 4,4-cyclopentadithiophene, a radical polymer, and/or an electroactive polymer. The electrically conductive fibers having a metallic surface may be stainless steel fibers, metal plated carbon fibers, and metal nanowires.

The nonconductive polymeric material may be polyethylene, polypropylene, and/or polyvinyl chloride. The hybrid polymer material made with these nonconductive polymeric materials is substantially pliable at temperatures between −40° C. and 125° C. This hybrid polymer material may be used to make a wire cable assembly that includes a wire cable surrounded by the hybrid polymer material.

The nonconductive polymeric material may alternatively be acrylic, polyester, polybutylene terephthalate, acrylonitrile butadiene styrene, and/or polyamide. The hybrid polymer material made with these nonconductive polymeric materials is substantially rigid at temperatures between −40° C. and 125° C. This hybrid polymer material may be used to manufacture an electrical assembly that includes a housing formed from the hybrid polymer material.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

A electrically conductive hybrid polymeric material, hereinafter referred to as a hybrid conductive polymer, is presented herein. The hybrid conductive polymer is a combination of a nonconductive polymeric base material, such as polyethylene, polypropylene, polyvinyl chloride, acrylic, polyester, polybutylene terephthalate, acrylonitrile butadiene styrene, or polyamide, a conductive polymeric material, e.g. an inherently conductive polymer, a radical polymer, or an electroactive polymer, and conductive filler particles, such as carbon nanotubes, graphite nanoparticles, graphene nanoparticles, fullerene nanoparticles, stainless steel fibers, metal nanowires, or metal plated carbon fibers, e.g. copper plated carbon fibers or nickel plated carbon fibers.

The combination of a conductive polymer in addition to conductive fillers allows improved connection between the network formed by the conductive filler particles. The orientation of the conductive filler particles must be random and in contact to transfer charge throughout the polymer matrix. By adding a conductive polymer, it bridges the gaps between the conductive filler particles, giving the hybrid conductive polymer a much more homogeneous conductivity without "hot spots" of conductive areas.

Figure 1:
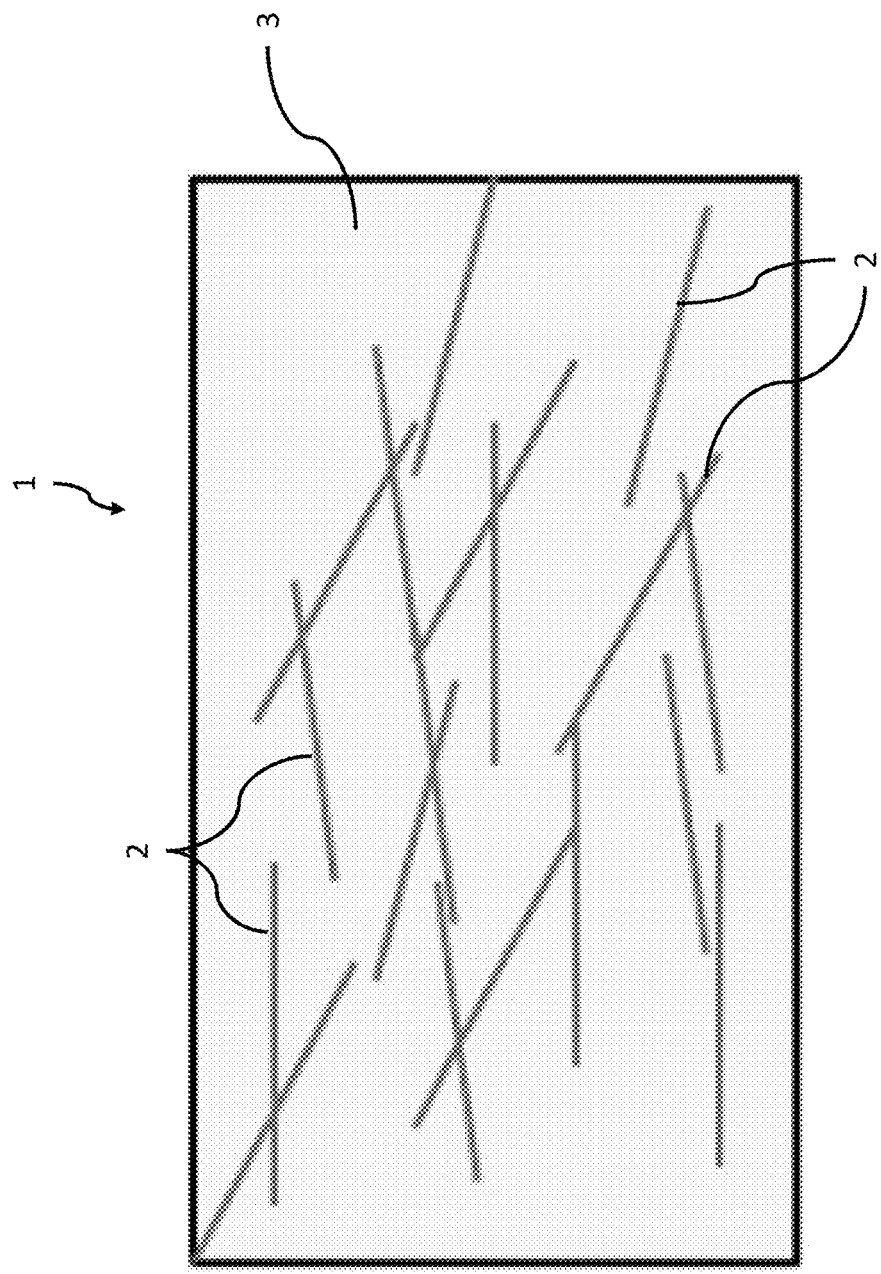
FIG. 1 is an enlarged cross section view of a conductive polymer material in accordance with the prior art.

Due to the inclusion of a conductive polymer in the hybrid conductive polymer, surface resistance is reduced. In prior art conductive polymers, such as shown in FIG. 1, a nonconductive polymer rich layer covers the surface of the conductive polymers isolating the conductive filler particles. In contrast, the conductive polymer in the hybrid conductive polymer provides surface contact through the insulating layer to the conductive filler particles.

This hybrid conductive polymer material can be used for ESD/antistatic protection or for EMI/RFI shielding applications. EMI shielding of electrical components such as controllers, modules, and connectors could be done with a housing formed of the hybrid conductive polymer material. Metal shields in many applications could be replaced with molded hybrid conductive polymer parts. The hybrid conductive polymer material could also be extruded onto wire cables to replace foil and braided EMI shields.

Figure 2:
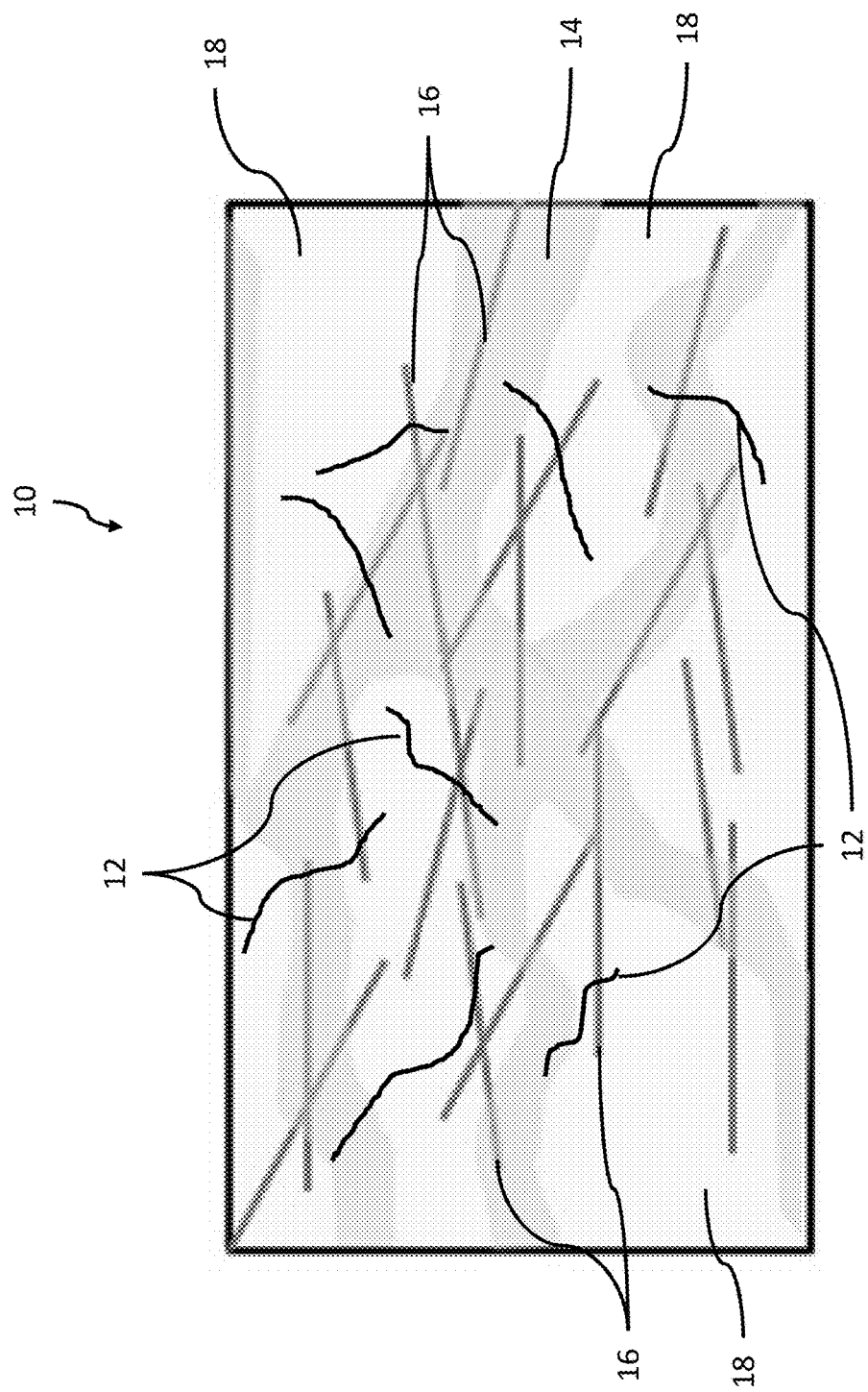
FIG. 2 is an enlarged cross section view of a hybrid conductive polymer material in accordance with an embodiment of the invention.

FIG. 2 illustrates one non-liming example of the hybrid conductive polymer 10 that has a formulation that includes 0.01% to 1% by weight of carbon nanoparticles 12, 1% to 10% by weight of a conductive polymeric material 14, 1% to 20% of electrically conductive fibers 16 having a metallic surface, and 69% or more by weight of a nonconductive polymeric base material 18. The hybrid conductive polymer 10 may also contain additives such as colorants, fire retardants, and reinforcing fillers that do not affect the electrical characteristics of the hybrid conductive polymer 10.

The carbon nanoparticles 12 may be carbon nanotubes, graphite nanoparticles, graphene nanoparticles, and/or fullerene nanoparticles. The carbon nanoparticles 12 have at least one dimension that falls within the nanoscale which typically ranges from 1 to 100 nanometers. It should also be understood that another dimension of the nanoparticles may be outside of the nanoscale. For example, a nanoparticle may be a carbon nanotube having a diameter that is within the nanoscale and a length that is longer than the nanoscale.

The conductive polymeric material 14 may be an inherently conductive polymer, such as polylanine 3, poly3,4-ethylenedioxythiophene 3 (PEDOT), 3,4-ethylenedioxythiophene 3 polystyrene sulfonate (PEDOT:PSS), and 4,4-cyclopentadithiophene (CPDT). The conductive polymeric material 14 may additionally or alternatively be an electrically conductive radical polymer such as poly(2,2,6,6-tetramethylpiperidinyloxy-4-yl methacrylate (PTMA). The conductive polymeric material 14 may additionally or alternatively be an electroactive polymer. As used herein, an electroactive polymers is a nonconductive polymer such as polyethylene or polyamide that includes a nanometal incorporated in the backbone of the polymer chain.

The electrically conductive fibers 16 that have a metallic surface may be stainless steel fibers, metal nanowires, or metal plated carbon fibers, e.g. copper plated carbon fibers or nickel plated carbon fibers. These electrically conductive fibers 16 may be in the nanoscale, i.e. having at least one dimension that falls within the range of 1 to 100 nanometers or they may be in the microscale, i.e. having at least one dimension that falls within the range of 1 to 100 microns.

Carbon nanoparticles 12, especially carbon nanotubes, have a large aspect ratio that drastically reduces the percolation threshold and provides effective EMI shielding at high frequencies. Metallic fibers 16 provide effective EMI shielding at both high and low frequencies. The conductive polymeric material 14 bridges the gaps between the carbon nanoparticles 12 and metallic fibers 16, thereby creating more homogeneous conductivity, lowering the overall electrical resistance and lowering the surface resistance of the substrate, thereby increasing EMI shielding effectiveness.

The nonconductive polymeric base material 18 would be selected based on the application of the hybrid conductive polymer 10. For example, the nonconductive polymeric base material 18 may be a material that is substantially pliable at temperatures within standard automotive operating range, i.e. between −40° C. and 125° C., such as polyethylene, polypropylene, and/or polyvinyl chloride. A hybrid conductive polymer 10 made with these nonconductive polymeric base materials is also pliable at temperatures within standard automotive operating range and may be used to provide a shield 106 within a shielded cable assembly as illustrated in FIG. 3.

Figure 3:
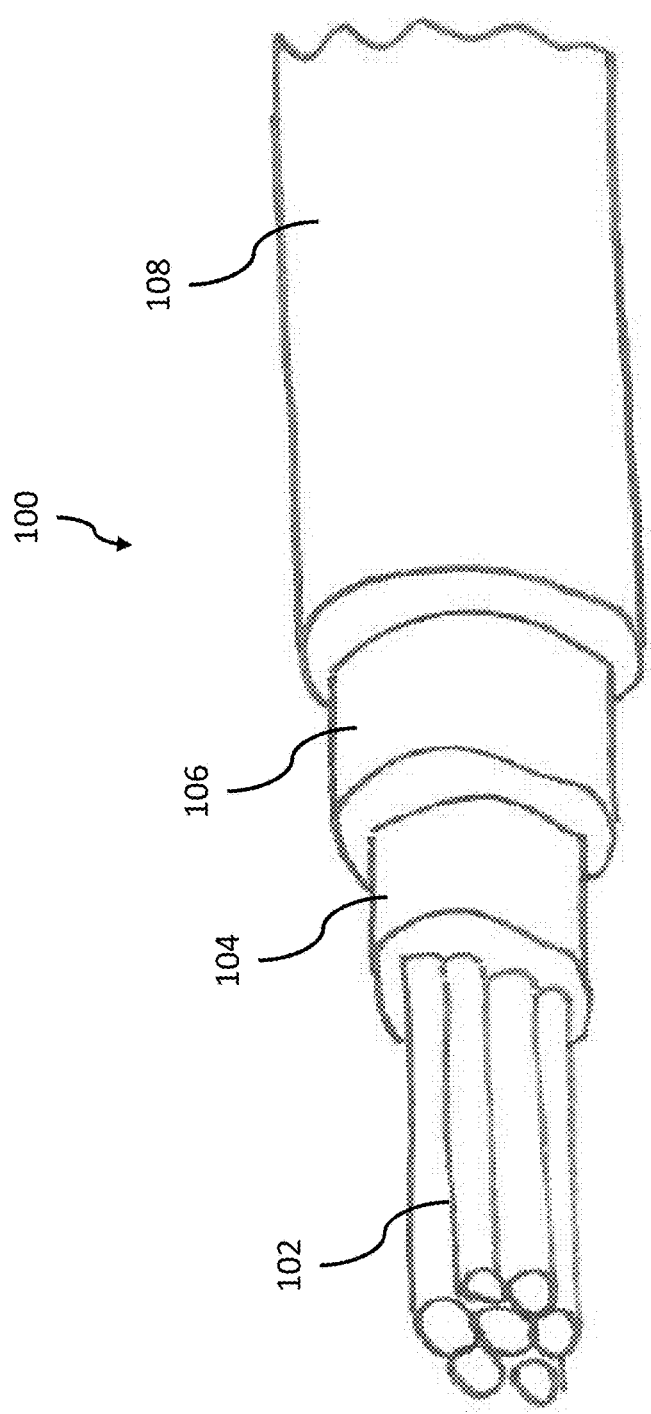
FIG. 3 is cut away view of a shielded wire cable assembly having a shield formed of the hybrid conductive polymer material of FIG. 2 in accordance with an embodiment of the invention.

A non-limiting example the shielded wire cable assembly 100 shown in FIG. 3 includes several wire stands 102 formed of an electrically conductive material such as copper, aluminum, or carbon nanotubes. The wire stands are surrounded by an inner insulating layer 104 formed of a nonconductive (dielectric) polymer such as polyethylene, polypropylene, and/or polyvinyl chloride that is extruded over the wire strands. A shield 106 is formed by extruding the hybrid conductive polymer 10 described in the previous paragraph over the inner insulating layer 104 so that it surrounds the inner insulating layer 104. The shielded wire cable assembly 100 may also include but is not limited by an outer insulating layer 108 that is formed of a nonconductive (dielectric) polymer such as polyethylene, polypropylene, and/or polyvinyl chloride that is extruded over the shield 106.

For other applications, the nonconductive polymeric material may alternatively be a material that is substantially rigid at temperatures within standard automotive operating range, i.e. between −40° C. and 125° C., such as acrylic, polyester, polybutylene terephthalate, acrylonitrile butadiene styrene, and/or polyamide. A hybrid conductive polymer 10 made with these nonconductive polymeric base materials is also rigid at temperatures within standard automotive operating range and may be used to a electromagnetically shielding housing for an electrical assembly as shown in FIG. 4.

Figure 4:
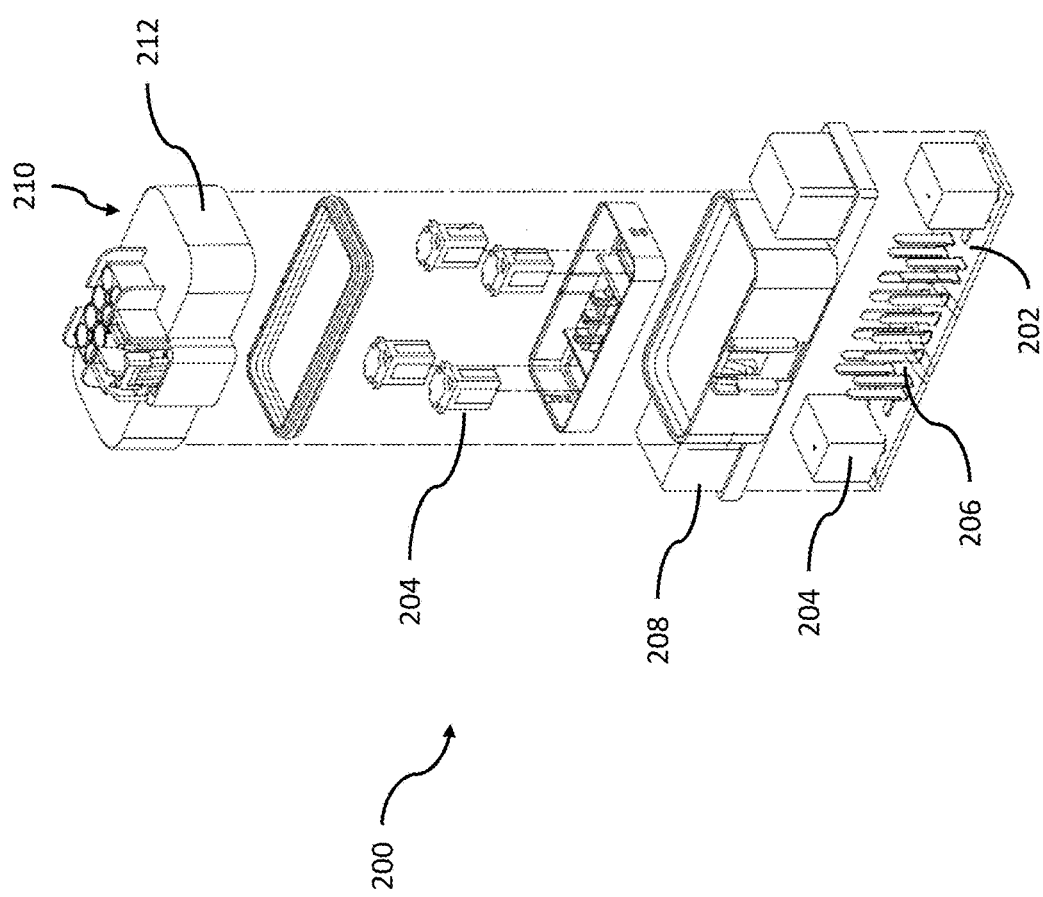
FIG. 4 is an exploded perspective view of an electrical assembly having a housing formed of the hybrid conductive polymer material of FIG. 2 in accordance with an embodiment of the invention.

A non-limiting example of the electrical assembly 200 shown in FIG. 4 includes a printed circuit board (PCB) 202 having a plurality of electrical components 204 and terminals 206 attached. The PCB 202, electrical components 204, and terminals 206 are contained within a housing 208 that is formed of the hybrid conductive polymer 10 described in the previous paragraph, for example by an injection molding process. The electrical assembly 200 also includes a connector 210 that interfaces with the terminals 206. The connector housing 212 of the connector 210 may also be formed of the hybrid conductive polymer 10 described in the previous paragraph.

Accordingly, a hybrid conductive polymer 10 is provided. The inclusion of carbon nanoparticles 12 lowers the percolation threshold and provides effective EMI shielding at high frequencies while the inclusion of metallic fibers 16 provide effective EMI shielding at both high and low frequencies. The conductive polymeric material 14 bridges the gaps between the carbon nanoparticles 12 and metallic fibers 16, thereby creating more homogeneous conductivity, lowering the overall electrical resistance and lowering the surface resistance of the substrate, thereby increasing EMI shielding effectiveness. By selecting the nonconductive base polymer, the resulting hybrid conductive polymer 10 may be a pliable material that is suitable for use in shielding wire cables or a rigid material that is suitable for making shielded housings for electrical assembles, such as controllers, modules, and connectors.

While the examples described here are directed to automotive applications, this hybrid conductive polymer 10 may be used in other applications where the electrical conductivity properties are beneficial.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

We claim:

1. An electrically conductive hybrid polymer material, comprising:
   0.01% to 0.2% by weight of carbon nanoparticles;
   1% to 10% by weight of a conductive polymeric material;
   11% to 20% by weight of electrically conductive fibers having a metallic surface; and
   69% or more by weight of a nonconductive polymeric material.

2. The hybrid polymer material according to claim 1, wherein the carbon nanoparticles are selected from the group consisting of carbon nanotubes, graphite nanoparticles, graphene nanoparticles, and fullerene nanoparticles.

3. The hybrid polymer material according to claim 1, wherein the conductive polymeric material is selected from the group consisting of inherently conductive polymers, radical polymers, and electroactive polymers.

4. The hybrid polymer material according to claim 3, wherein the inherently conductive polymers are selected from the group consisting of: polylanine, 3,4-ethylenedioxythiophene, 3,4-ethylenedioxythiophene polystyrene sulfonate, and 4,4-cyclopentadithiophene.

5. The hybrid polymer material according to claim 1, wherein the electrically conductive fibers having a metallic surface are selected from the group consisting of stainless steel fibers, metal plated carbon fibers, and metal nanowires.

6. The hybrid polymer material according to claim 1, wherein the nonconductive polymeric material is selected from the group consisting of: polyethylene, polypropylene, and polyvinyl chloride.

7. The hybrid polymer material according to claim 6, wherein the hybrid polymer material is substantially pliable at temperatures between −40° C. and 125° C.

8. A wire cable assembly, comprising:
   a wire cable; and
   the hybrid polymer material according to claim 6 surrounding the wire cable.

9. The hybrid polymer material according to claim 1, wherein the nonconductive polymeric material is selected from the group consisting of: acrylic, polyester, polybutylene terephthalate, acrylonitrile butadiene styrene, and polyamide.

10. The hybrid polymer material according to claim 9, wherein the hybrid polymer material is substantially rigid at temperatures between −40° C. and 125° C.

11. An electrical assembly comprising a housing formed of the hybrid polymer material according to claim 9.

12. An electrically conductive hybrid polymer material, essentially consisting of:
   0.01% to 0.2% by weight of carbon nanoparticles;
   1% to 10% by weight of a conductive polymeric material;
   11% to 20% by weight of electrically conductive fibers having a metallic surface; and
   a remaining percentage by weight of a nonconductive polymeric material.

13. The hybrid polymer material according to claim 12, wherein the carbon nanoparticles are selected from the group consisting of carbon nanotubes, graphite nanoparticles, graphene nanoparticles, and fullerene nanoparticles.

14. The hybrid polymer material according to claim 12, wherein the conductive polymeric material is selected from the group consisting of inherently conductive polymers, radical polymers, and electroactive polymers.

15. The hybrid polymer material according to claim 14, wherein the inherently conductive polymers are selected from the group consisting of: polylanine, 3,4-ethylenedioxythiophene, 3,4-ethylenedioxythiophene polystyrene sulfonate, and 4,4-cyclopentadithiophene.

16. The hybrid polymer material according to claim 12, wherein the electrically conductive fibers having a metallic surface are selected from the group consisting of stainless steel fibers, metal plated carbon fibers, and metal nanowires.

17. The hybrid polymer material according to claim 12, wherein the nonconductive polymeric material is selected from the group consisting of: polyethylene, polypropylene, and polyvinyl chloride.

18. A wire cable assembly, comprising:
   a wire cable; and
   the hybrid polymer material according to claim 17 surrounding the wire cable.

19. The hybrid polymer material according to claim 12, wherein the nonconductive polymeric material is selected from the group consisting of: acrylic, polyester, polybutylene terephthalate, acrylonitrile butadiene styrene, and polyamide.

20. An electrical assembly comprising a housing formed of the hybrid polymer material according to claim 19.

* * * * *